United States Patent
Sommers et al.

(10) Patent No.: US 12,198,903 B2
(45) Date of Patent: Jan. 14, 2025

(54) PLASMA RESISTANT ARC PREVENTATIVE COATINGS FOR MANUFACTURING EQUIPMENT COMPONENTS

(71) Applicant: Applied Materials, Inc., Santa Clara, CA (US)

(72) Inventors: Joseph Frederick Sommers, Roseville, CA (US); Joseph Frederick Behnke, San Jose, CA (US); Xue Yang Chang, San Jose, CA (US); Anwar Husain, Pleasanton, CA (US); Alexander Alhajj Sulyman, Orinda, CA (US); Timothy Joseph Franklin, Campbell, CA (US); David J. Coumou, Rochester, NY (US)

(73) Assignee: Applied Materials, Inc., Santa Clara, CA (US)

( * ) Notice: Subject to any disclaimer, the term of this patent is extended or adjusted under 35 U.S.C. 154(b) by 403 days.

(21) Appl. No.: 17/548,219

(22) Filed: Dec. 10, 2021

(65) Prior Publication Data
US 2023/0187182 A1 Jun. 15, 2023

(51) Int. Cl.
*H01J 37/32* (2006.01)
*B05D 1/12* (2006.01)
(Continued)

(52) U.S. Cl.
CPC .......... *H01J 37/32495* (2013.01); *B05D 1/12* (2013.01); *B05D 3/12* (2013.01);
(Continued)

(58) Field of Classification Search
CPC ........... H01J 37/32495; H01J 37/32467; H01J 37/32715; H01J 2237/334;
(Continued)

(56) References Cited

U.S. PATENT DOCUMENTS 5,885,663 A * 3/1999 Longo ................. B05D 1/10
427/455
6,841,263 B2 1/2005 Anderson et al.
(Continued)

FOREIGN PATENT DOCUMENTS

WO WO2021072040 A1 * 4/2021

OTHER PUBLICATIONS

Tan, "The Search for Enhanced Dielectric Strength of Polymeric-based dielectrics: A focused Review on Polymer Nanocomposites," J.Appl.Polym. Sci., Apr. 5, 2020; p. 3 of 32 (137:e49379; https://doi.org/10.1002/app.49379) (Year: 2020).*
(Continued)

*Primary Examiner* — Cynthia L Schaller
(74) *Attorney, Agent, or Firm* — LOWENSTEIN SANDLER LLP

(57) ABSTRACT

A method includes depositing a first layer of a first material onto a surface of a chamber component of a processing chamber. The first material comprises a polymer, the polymer having a dielectric strength of at least 40 MV/m. The method further includes depositing a second layer of a second material onto the first layer. The second material comprises a first ceramic material impregnated into the first polymer or a second polymer. The method further includes depositing a third layer. The third layer is of a third material. The third material includes the first ceramic material or a second ceramic material. The third material does not adhere to the first polymer or the second polymer. The third material does adhere to the first ceramic material or the second ceramic material of the second layer.

20 Claims, 6 Drawing Sheets

(51) Int. Cl.
*B05D 3/12* (2006.01)
*B05D 7/00* (2006.01)

(52) U.S. Cl.
CPC .......... *B05D 7/58* (2013.01); *H01J 37/32467* (2013.01); *H01J 37/32715* (2013.01); *H01J 2237/334* (2013.01)

(58) Field of Classification Search
CPC ....... H01J 37/32477; B05D 1/12; B05D 3/12; B05D 7/58; C23C 4/02; C23C 4/10; C23C 4/11; C23C 4/129; C23C 4/131; C23C 4/134; C23C 4/18; C23C 14/08; C23C 16/4404
See application file for complete search history.

(56) References Cited

U.S. PATENT DOCUMENTS

| | | |
|---|---|---|
| 10,851,026 B2 | 12/2020 | Li et al. |
| 2004/0023047 A1 | 2/2004 | O'Donnell et al. |
| 2005/0100667 A1 | 5/2005 | Mayer et al. |
| 2016/0379806 A1 | 12/2016 | Xu et al. |
| 2017/0260616 A1 | 9/2017 | Lee et al. |
| 2020/0211885 A1* | 7/2020 | Taga ........................ C23C 28/00 |
| 2022/0130705 A1* | 4/2022 | Smith ............... H01L 21/68785 |

OTHER PUBLICATIONS

International Search Report and Written Opinion for International Application No. PCT/US2022/051730, mailed Apr. 20, 2023, 9 Pages.

* cited by examiner

PLASMA RESISTANT ARC PREVENTATIVE COATINGS FOR MANUFACTURING EQUIPMENT COMPONENTS

TECHNICAL FIELD

Embodiments of the present disclosure relate, in general, to coatings for components of manufacturing equipment. More specifically, the present disclosure relates to plasma resistant arc preventative coatings for manufacturing equipment components.

BACKGROUND

Various manufacturing processes expose chamber components and their coating materials to high temperatures, high energy plasma, a mixture of corrosive gases, high stress, high strength electric fields, and combinations thereof. These extreme conditions may increase the components' and the coating materials' susceptibility to defects. Coatings are used which are effective at protecting chamber components from one or more of these damaging conditions. In some cases, a coating which protects against multiple conditions may be applicable to a particular component, chamber, process, etc. In some cases, multi-layer components may be capable of protecting chamber components against multiple damaging conditions.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a method for coating a chamber component of a processing chamber is described. The method includes depositing a first layer of a first material onto a surface of the chamber component. The first material includes a first polymer. The first polymer has a dielectric strength (the maximum electric field that a material can withstand before undergoing electrical breakdown) of at least 40 megavolts per meter (MV/m). The method further includes depositing a second layer of a second material onto the first layer. The second material includes a polymer, which may be the first polymer or a second polymer. The second material includes a first ceramic material impregnated into the polymer of the second layer. The method includes depositing a third layer of a third material onto the second layer. The third material includes the first ceramic material or a second ceramic material. The third material does not adhere to the first material. The third material does adhere to the ceramic material of the second material.

In another aspect of the disclosure, a chamber component for a processing chamber is described. The chamber component includes a body and a coating deposited on the body. The coating includes a first layer of a first material, deposited on a surface of the chamber component. The first material includes a first polymer having a dielectric strength of at least 40 MV/m. The coating also includes a second layer of a second material. The second material includes a first ceramic material. The first ceramic material is impregnated within the first polymer or a second polymer. The coating also includes a third layer of a third material. The third material includes the first ceramic material or a second ceramic material. The first ceramic material or the second ceramic material of the third layer does not adhere to the first polymer or the second polymer. The first ceramic material or second ceramic material of the third layer does adhere to the first ceramic material of the second layer.

In another aspect of the disclosure, a processing chamber is described. The processing chamber includes a substrate support. The substrate support includes a coating deposited on a surface of the substrate support. The coating includes a first layer of a first material deposited on the surface of the substrate support. The first material includes a first polymer having a dielectric strength of at least 40 MV/m. The coating also includes a second layer of a second material. The second material includes a first ceramic material. The first ceramic material of the second layer is impregnated into the first polymer or a second polymer. The coating also includes a third layer of a third material. The third material includes the first ceramic material or a second ceramic material. The first ceramic material or the second ceramic material of the third layer does not adhere to the first polymer or the second polymer of the second layer. The first ceramic material or the second ceramic material of the third layer does adhere to the first ceramic material of the second layer.

BRIEF DESCRIPTION OF THE DRAWINGS

The present disclosure is illustrated by way of example, and not by way of limitation. It should be noted that different references to "an" or "one" embodiment in this disclosure are not necessarily to the same embodiment, and such references mean at least one.

DETAILED DESCRIPTION

Figure 1:
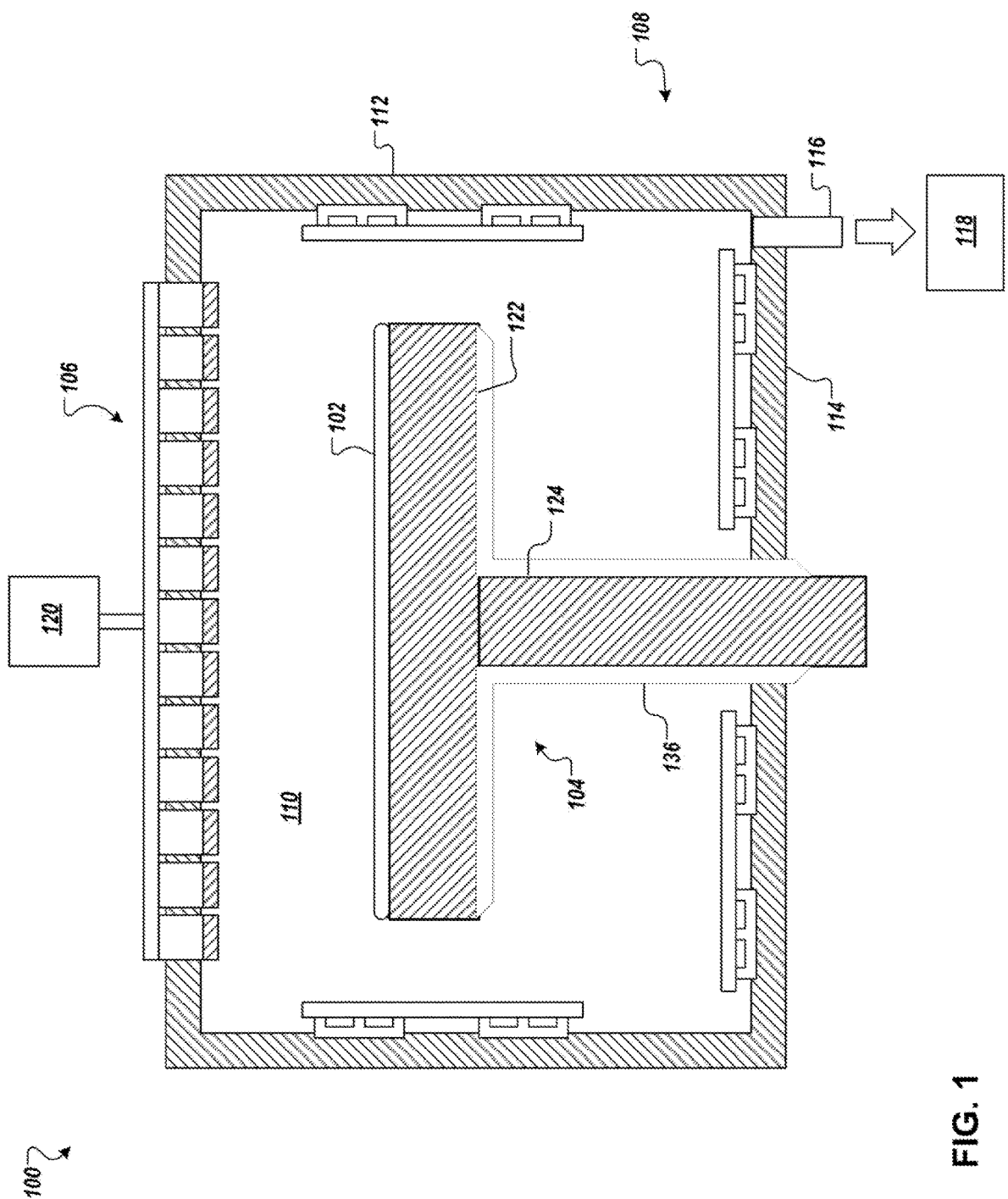
FIG. 1 is a sectional view of a processing chamber having one or more chamber components that may be coated with a dual arcing resistant and plasma resistant coating, according to some embodiments.

Described herein are technologies related to providing protection to components of a manufacturing chamber by coating components in one or more resistant materials. Manufacturing equipment (e.g., processing chambers) is used to process substrates, such as semiconductor wafers. The properties of substrates are determined by the conditions in which the substrates were processed. Components of the processing chamber impact conditions proximate to the substrate, and have an effect on performance (e.g., target substrate properties, consistency of production, etc.). In some embodiments, components of the processing chamber may experience harsh or damaging environments. Coating components in a resistant material may protect them from wear and/or damage due to these environments.

In some embodiments, processing may include large amounts of electrical energy, e.g., large currents, voltages, etc., in components of the processing chamber. In cases such as this, arcing may occur across gaps between manufacturing equipment components (e.g., intentional gaps, gaps induced by small manufacturing differences in the flatness or smoothness of adjacent surfaces, etc.). Arcing may result in damage to components, damage to substrates, unfavorable conditions, unintentional plasma generation, etc. Arcing occurs, for instance, when an electric field is strong enough to overcome the bonding energy of electrons of an insulator (e.g., air) and cause electric current to flow through the insulator. In vacuum, similar phenomena may be caused by electric fields strong enough to liberate electrons from a component to travel through the vacuum to another component, or electric fields that accelerate electrons liberated by other means.

In some embodiments, plasma may be used to process a substrate. Plasma processing may include generating a plasma from a halogen-containing gas, such as $C_2F_6$, $SF_6$, $SiCl_4$, HBr, $NF_3$, $CF_4$, $CHF_3$, $CH_2F_3$, $F_2$, $NF_3$, $Cl_2$, $CCl_4$, $BCl_3$, and $SiF_4$, among others, and other gases such as $O_2$ or $N_2O$. Plasma may interact with components of the processing chamber. Contact with plasma may cause damage or wear to components of the processing chamber.

Methods and devices of the current disclosure address at least some deficiencies of a conventional approach. In some embodiments, a component of a manufacturing chamber may be affected both by large amounts of electrical energy and plasma introduced for substrate processing. Arcing prevention may be accomplished by coating one or more components (or part of a component) in a material with a high dielectric strength, e.g., a material that resists arcing to high electric field strengths. Many polymers, for example, exhibit high dielectric strength. Resistance to damage from interactions with plasma may be reduced by applying a plasma resistant coating to one or more components of a processing chamber. A plasma resistant coating is composed of a material that is resistant to erosion and corrosion due to exposure to plasma processing conditions. The resistance of the coating material to plasma may be measured through "etch rate" (ER), which may have units of Angstrom/min (Å/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a plasma resistant coating material. A single plasma resistant material may have multiple different plasma resistance or erosion rate values. For example, a plasma resistant material may have a first plasma resistance or erosion rate associated with a first type of plasma and a second plasma resistance or erosion rate associated with a second type of plasma. Many ceramic materials, including oxide ceramics, carbide ceramics, and nitride ceramics exhibit such low erosion rates and may be used as plasma resistant coating materials.

Materials with a high dielectric strength (e.g., polymers, such as ethylene chlorotrifluoroethylene) may not exhibit sufficient plasma resistance for use in a plasma processing chamber (e.g., etch chamber). Materials with a high resistance to plasma (e.g., metal oxides) may not exhibit a high dielectric strength. Polymers also tend to adhere weakly to other materials—in particular, plasma resistant ceramics do not generally adhere well to polymer materials. In the case of chamber components, coatings may be robust enough to withstand processing conditions, handling (e.g., during maintenance events), thermal stress, cleaning, and machining (e.g., polishing). The adhesion between a polymer layer and a ceramic layer may not have such a capacity.

Embodiments of the current disclosure are directed at a multi-layer coating for chamber components which protects both against arcing and damage from plasma. The multi-layer coating may include at least three layers, where a polymer layer protects against arcing, a ceramic layer is composed of a plasma resistant ceramic material and provides plasma resistance, and an intermediate layer provides adhesion between the other polymer layer and the ceramic layer. In embodiments, the intermediate layer is composed of (e.g., comprises or consists of) a that includes a polymer impregnated with particles of a ceramic material. The polymer of the material may be able to bond with the polymer layer deposited on the chamber component. The polymer layer may be a base layer and may provide insulation against arcing effects. The ceramic particles of the material in the intermediate layer may provide points to anchor the ceramic layer, which may exhibit a high degree of plasma resistance.

Embodiments of the present disclosure enable an article such as a chamber component for a processing chamber to be manufactured that has both a layer of high dielectric strength and a plasma resistant coating layer on one or more surfaces of the article. The high dielectric strength layer includes a polymer. The polymer may include polymers of ethylene (e.g., polymers of ethylene monomers, which may or may not be synthesized directly from ethylene) and related compounds, such as fluorine or chlorine-substituted ethylene (e.g., polymers including fluorinated ethylene monomers, polymers including chlorinated ethylene monomers).

The polymer may be deposited on the chamber component using any suitable means, such as blade coating, spray coating, thermal spray coating, aerosol deposition, pulsed laser deposition, plasma polymerization, flow coating, spin coating, dip coating, etc. The plasma resistant coating layer may be deposited on the article using various techniques, such as plasma spraying techniques, thermal spraying techniques such as detonation spraying, wire arc spraying, high velocity fuel (HVOF) spraying, flame spraying, warm spraying and cold spraying, aerosol deposition, e-beam evaporation, electroplating, ion assisted deposition (IAD), physical vapor deposition (PVD), chemical vapor deposition (CVD), and plasma assisted deposition. The plasma resistant coating layer may include one ceramic material or a mixture of ceramic materials. Some materials that may be used include oxide-based ceramics, such as $SiO_2$ (quartz), $Al_2O_3$, $Y_2O_3$, $Y_4Al_2O_9$, $Y_2O_3$—$ZrO_2$, and so on. The plasma resistant coating may include carbide-based ceramics, such as SiC, Si—SiC, etc. The plasma resistant coating may contain nitride based ceramics, such as AlN, SiN, etc. The plasma resistant coating may include any of these compounds, among others, and combinations thereof. The improved erosion resistance of the plasma resistant coating material with the article that is coated and the improved arcing resistance of the base polymer layer with the article that is coated may improve the service life of the article, while reducing maintenance and manufacturing cost.

FIG. 1 is a sectional view of a processing chamber 100 having one or more chamber components that may be coated with a dual arcing resistant and plasma resistant coating, according to some embodiments. Processing chamber 100 may be used for processes in which components of processing chamber 100 carry high amounts of electrical energy, such as large currents, voltages, etc. Processing chamber 100 may be used for processes in which a corrosive plasma environment having plasma processing conditions is provided. For example, the processing chamber 100 may be a chamber for a plasma etcher or plasma etch reactor, a plasma cleaner, and so forth. Examples of chamber components that may include an arcing resistant and plasma resistant coating include a substrate support assembly 104, an electrostatic chuck (ESC), a ring (e.g., a process kit ring or single ring), a chamber wall, a base, a gas distribution plate, a showerhead 106, a nozzle, a lid, a liner, a liner kit, a shield, a plasma screen, a flow equalizer, a cooling base, a chamber viewport, a chamber lid, and so on. The coating applied to one or more components of the chamber may include a polymer component and a ceramic component.

As illustrated, the substrate support assembly 104 has an arcing resistant and plasma resistant coating 136, in accordance with one embodiment. It should be understood that any of the other chamber components, such as those listed above, may also include an arcing resistant and plasma resistant coating.

In one embodiment, processing chamber 100 includes a chamber body 108 and a showerhead 106 that enclose an interior volume 110. The showerhead may include a showerhead base and a showerhead gas distribution plate. Alternatively, the showerhead 106 may be replaced by a lid and a nozzle in some embodiments. The chamber body 108 may be fabricated from aluminum, stainless steel or other suitable material. The chamber body 108 generally includes sidewalls 112 and a bottom 114. Any of the showerhead 106 (or lid and/or nozzle), sidewalls 112 and/or bottom 114 may include an arcing and plasma resistant coating layer.

An exhaust port 116 may be defined in the chamber body 108, and may couple the interior volume 110 to a pump system 118. The pump system 118 may include one or more pumps and throttle valves utilized to evacuate and regulate the pressure of the interior volume 110 of processing chamber 100.

Showerhead 106 may be supported on the sidewall 112 of the chamber body 108. The showerhead 106 (or lid) may be opened to allow access to the interior volume 110 of processing chamber 100, and may provide a seal for processing chamber 100 while closed. A gas panel 120 may be coupled to processing chamber 100 to provide process and/or cleaning gases to the interior volume 110 through showerhead 106 or lid and nozzle. Showerhead 106 is used for processing chambers used for dielectric etch (etching of dielectric materials). The showerhead 106 includes a gas distribution plate (GDP) having multiple gas delivery holes throughout the GDP. Showerhead 106 may include the GDP bonded to an aluminum base or an anodized aluminum base. The GDP may be made from Si or SiC, or may be a ceramic such as $Y_2O_3$, $Al_2O_3$, YAG, and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base, GDP and/or nozzle may be coated with a arcing and plasma resistant coating layer according to an embodiment.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 104 is disposed in the interior volume 110 of the processing chamber 100 below the showerhead 106 or lid. The substrate support assembly 104 holds the substrate 102 during processing. A ring (e.g., a single ring) may cover a portion of the support assembly 104 (e.g., susceptor 122), and may protect the covered portion from exposure to plasma during processing. The ring may be silicon or quartz in one embodiment. Substrate support assembly 104 may include a pedestal 124, and a susceptor 122.

FIG. 1 depicts a protective coating 136 disposed on some surfaces of substrate support assembly 104. Other components of the processing chamber may be coated in the same coating or a different coating. Coating 136 may be composed of several layers of various materials to provide both arcing resistance by exhibiting a high dielectric strength and plasma resistance via a layer of ceramic material. In some embodiments, coating 136 may include a layer of a polymer. In some embodiments, the polymer layer may be applied directly to the body of the chamber component (e.g., metal component body and/or ceramic component body), e.g., by aerosol deposition. Aerosol deposition will be discussed in more detail in connection with FIG. 3.

In some embodiments, layers of coating 136 may not be applied to the same portion of the surface of a chamber component. For example, in some embodiments a polymer layer may be applied to a larger area of the surface of the chamber component than a ceramic layer. In some embodiments, a chamber component may extend beyond an area where some type of hazardous condition exits. Substrate support assembly 104, as depicted, extends from inner volume 110, through chamber bottom 114 to an area outside the chamber. This region of substrate support assembly 104 may not encounter plasma conditions. This region may still be protected from arcing with a polymer layer. In some embodiments, a seal is made between parts (e.g., to maintain vacuum conditions of inner volume 110). In some embodiments, a seal may be made on a surface coated with at least some components of coating 136. For example, a polymer layer of coating 136 may extend through chamber bottom 114, and a seal may be made (e.g., with an o-ring, a gasket, etc.) between chamber bottom 114 and coating 136.

Figure 2A:
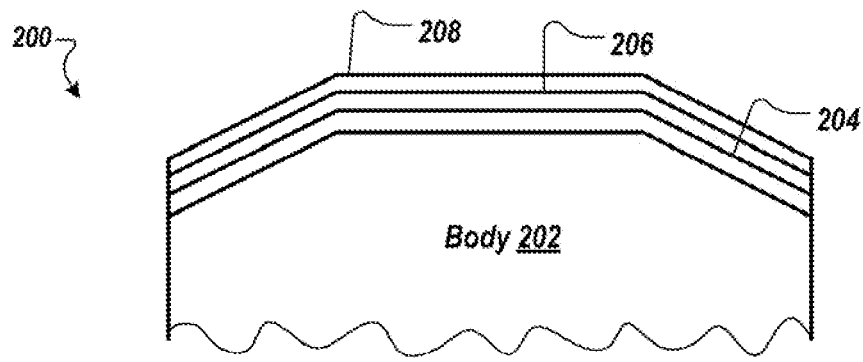
FIGS. 2A-B depict sectional views of exemplary coated articles, according to some embodiments.
Figure 2B:
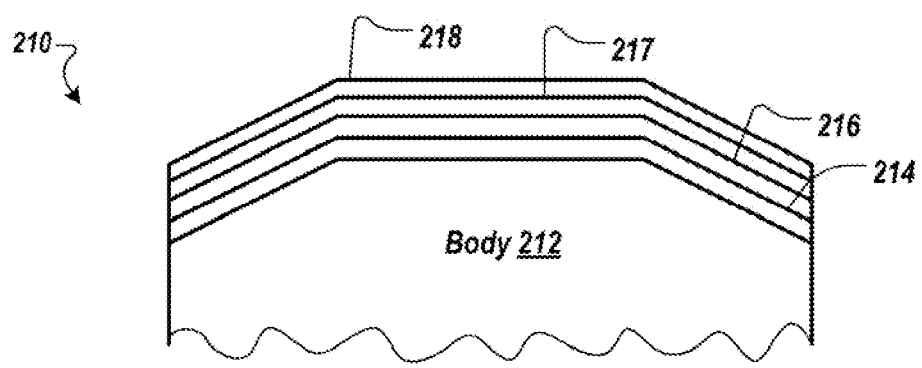

FIGS. 2A-B depict sectional views of exemplary coated articles, according to some embodiments. FIG. 2A illustrates a coated article 200 having a body 202 and layers of coatings 240, 206, and 208. Body 202 may be a body of any of various chamber components including but not limited to substrate support assembly, an electrostatic chuck (ESC), a ring (e.g., a process kit ring or single ring), a chamber wall, a base, a gas distribution plate, a showerhead, a nozzle, a lid, a liner, a liner kit, a shield, a plasma screen, a flow equalizer, a cooling base, a chamber viewport, a chamber lid, and so on. The body may be made from a metal (such as aluminum, stainless steel, etc.), a ceramic, a metal-ceramic composite, a polymer, a polymer ceramic composite, or other suitable materials.

In some embodiments, a coating layer 204 applied directly to body 202 may include a polymer material. In some embodiments, one or more primer layers are applied to body 202 before coating layer 204. Polymer materials tend to exhibit high dielectric strengths, e.g., have high resistance to breakdown or arcing in high electric field environments. A polymer may be provided for coating layer 204 with a high dielectric strength, for example, above 20 MV/m, above 40 MV/m, above 50 MV/m, above 70 MV/m, or any other threshold appropriate for the intended use of body 202. Other considerations may also be included in a determination of a material to use in coating layer 204, for example thermal expansions properties, ease of working with the material, chemical properties, physical properties, surface properties, affinity for the material of body 202, etc. Coating layer 204 may be applied using any technique suitable for depositing a thin layer of polymer on a body, such as aerosol coating, dip coating, blade coating, spin coating, etc.

A wide range of polymers may be suitable for coating layer 204. Suitable polymers may include polymers of ethylene, polymers of propylene, polymers of styrene, polymers comprising monomers of more than one structure, polymers including fluorinated or chlorinated versions of these monomers, or other polymers. Suitable polymers may include polyethylene, polytetrafluoroethylene, ethylene chlorotrifluoroethylene, ethylene tetrafluoroethylene, polyether ether ketone, etc. In some embodiments, a mixture of polymers may be used. In some embodiments, coating layer 204 may include other additives, in addition to the polymer or polymers included in coating layer 204, such as plasticizers, materials to enhance durability or resistance, etc. Coating layer 204 may be of any appropriate thickness, from a few thousandths of an inch to a few hundredths of an inch thick. In some embodiments, coating layer 204 may be between 2 and 15 thousandths of an inch thick. In some embodiments, coating layer 204 may be between 3 and 10 thousandths of an inch thick. In some embodiments, the surface of coating layer 204 may undergo further processing after deposition (e.g., polishing, smoothing, etc.).

In some embodiments, coating layer 208 may provide plasma resistance to body 202 and to underlying coating layers (e.g., layer 206). Plasma resistant coating layer 208 may be coated on the body through various techniques depending on the chosen application and coating properties. Some of the coating techniques may be plasma spraying techniques, thermal spraying techniques such as detonation spraying, wire arc spraying, high velocity fuel (HVOF) spraying, flame spraying, warm spraying and cold spraying, aerosol deposition, e-beam evaporation, electroplating, ion assisted deposition (IAD), physical vapor deposition (PVD), chemical vapor deposition (CVD), and plasma assisted deposition. Plasma resistant coating layer 208 may include one or more plasma resistant materials.

Plasma resistant coating layer 208 may include ceramic materials (e.g., plasma resistant ceramic materials), such as ceramic oxides (e.g., alumina $Al_2O_3$, yttria $Y_2O_3$, yttrium aluminum garnet $Y_3Al_5O_{12}$, yttrium aluminum perovskite $YAlO_3$, zirconia $ZrO_2$, silicon dioxide $SiO_2$, $Er_2O_3$, $ErAl_xO_y$, $YAl_xO_y$, $YZr_xO_y$, and $YZr_xAl_yO_z$, $Gd_2O_3$, $Yb_2O_3$, $Y_2O_3$ stabilized $ZrO_2$ (YSZ), $Er_3Al_5O_{12}$ (EAG), a $Y_2O_3$—$ZrO_2$ solid solution, or a composite ceramic comprising $Y_4Al_2O_9$ and a solid solution of $Y_2O_3$—$ZrO_2$, etc.), ceramic carbides (e.g., silicon carbide SiC, silicon-silicon carbide Si—SiC, boron carbide $B_4C$, etc.), nitride based ceramics (e.g., aluminum nitride AlN, silicon nitride SiN, etc.), other ceramic materials, or combinations of materials. Some additional examples of ceramic oxides that may be used for the plasma resistant coating layer 208 include yttrium-based oxides, erbium-based oxides, and so on. Additionally, ceramic fluorides and/or oxyfluorides may be used for the plasma resistant coating layer 208. Examples include $YO_xF_y$, $YF_3$, and so on.

In one embodiment, the plasma resistant coating layer 208 is a metal oxide coating that includes or consists of a solid solution of yttria and zirconia ($Y_2O_3$—$ZrO_2$). The solid solution of $Y_2O_3$—$ZrO_2$ may include 20-80 mol % $Y_2O_3$ and 20-80 mol % $ZrO_2$ in one embodiment. In a further embodiment, the solid solution of $Y_2O_3$—$ZrO_2$ includes 30-70 mol % $Y_2O_3$ and 30-70 mol % $ZrO_2$. In a further embodiment, the solid solution of $Y_2O_3$—$ZrO_2$ includes 40-60 mol % $Y_2O_3$ and 40-60 mol % $ZrO_2$. In a further embodiment, the solid solution of $Y_2O_3$—$ZrO_2$ includes 50-80 mol % $Y_2O_3$ and 20-50 mol % $ZrO_2$. In a further embodiment, the solid solution of $Y_2O_3$—$ZrO_2$ includes 60-70 mol % $Y_2O_3$ and 30-40 mol % $ZrO_2$. In other examples, the solid solution of $Y_2O_3$—$ZrO_2$ may include 45-85 mol % $Y_2O_3$ and 15-60 mol % $ZrO_2$, 55-75 mol % $Y_2O_3$ and 25-45 mol % $ZrO_2$, 58-62 mol % $Y_2O_3$ and 38-42 mol % $ZrO_2$, and 68-72 mol % $Y_2O_3$ and 28-32 mol % $ZrO_2$.

In various embodiments, the plasma resistant coating layer 208 may be composed of $Y_3Al_5O_{12}$ (YAG), $Y_4Al_2O_9$ (YAM), $Er_3Al_5O_{12}$ (EAG), $Gd_3Al_5O_{12}$ (GAG), $YAlO_3$ (YAP), $Er_4Al_2O_9$(EAM), $ErAlO_3$ (EAP), $Gd_4Al_2O_9$ (GdAM), $GdAlO_3$ (GdAP), $Nd_3Al_5O_{12}$ (NdAG), $Nd_4Al_2O_9$ (NdAM), $NdAlO_3$ (NdAP), and/or a ceramic compound comprising $Y_4Al_2O_9$ and a solid-solution of $Y_2O_3$—$ZrO_2$. The plasma resistant coating layer 208 may also be Er—Y compositions (e.g., Er 80 wt % and Y 20 wt %), Er—Al—Y compositions (e.g., Er 70 wt %, Al 10 wt %, and Y 20 wt %), Er—Y—Zr compositions (e.g., Er 70 wt %, Y 20 wt % and Zr 10 wt %), or Er—Al compositions (e.g., Er 80 wt % and Al 20 wt %). Note that wt % means percentage by weight. In contrast, mol % is molar ratio.

The plasma resistant coating layer 208 may also be based on a solid solution formed by any of the aforementioned ceramics. With reference to the ceramic compound comprising $Y_4Al_2O_9$ and a solid-solution of $Y_2O_3$—$ZrO_2$, in one embodiment, the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

Any of the aforementioned plasma resistant coating layers 208 may contain one or more dopants that combined comprise up to about 2 mol % of the coating. Such dopants may be rare earth oxides from the lanthanide series, such as Er (erbium), Ce (cerium), Gd (gadolinium), Yb (ytterbium), Lu (lutetium), and so on. Such dopants may additionally or alternatively include Al (aluminum) and/or Si (silicon).

Plasma resistant coating layer 208 may be of any appropriate thickness. In some embodiments, coating layer 208 may be between 5 and 40 thousandths of an inch thick. In some embodiments, coating layer 208 may be between 8 and 30 thousandths of an inch. In some embodiments, coating layer 208 may be between 10 and 25 thousandths of an inch thick. In some embodiments, the surface of coating layer 208 may be worked after deposition, for example, the surface of coating layer 208 may be polished after deposition.

In some cases, materials of a plasma resistant layer 208 may not adhere (e.g., may not adhere with sufficient strength to resist lamination or separation under normal manufacturing or operating conditions of body 202) to polymer materials of coating layer 204. Coating layer 206 may be considered a transition layer, exhibiting sufficient adhesion to both coating layer 204 and coating layer 208. Coating layer 206 may include a polymer material. The polymer material may be of the same or different composition as the polymer of coating layer 204. The polymer material may include any of the materials discussed in connection with coating layer 204. Coating layer 206 may also include a ceramic material. The ceramic material may include any of the materials discussed above in connection with coating layer 208. The ceramic material of layer 206 may be the same as or different from the material of layer 208. The ceramic material may be impregnated as small particles into the polymer material of layer 206. In some embodiments, ceramic material particles may be up to 100 μm in size. In some embodiments, ceramic material particles of layer 206 may be between 1 μm and 80 μm in size. Composition (e.g., ratio of polymer material to ceramic material) of layer 206 may be tuned for a particular application, chamber, component, etc. In some embodiments, material of layer 206 may include between 10 and 90 percent ceramic material (measured by volume). In some embodiments, material of layer 206 may include between 20 and 80 percent ceramic material. In some embodiments, ceramic material of layer 208 may, without being bound by theory, utilize ceramic particles of layer 206 to anchor layer 208 to layer 206. In some embodiments, the surface of coating layer 206 may be roughened. Roughening may increase the exposure of ceramic particles of layer 206 (e.g., may increase the surface area of exposed ceramic material). Coating layer 206 may be roughened to an Ra (arithmetic average of deviations from an average height) value of between 8 and 64 thousandths of an inch. In one embodiment, roughening is performed using bead blasting or sand blasting of the coating layer 206. Alternatively, other roughening processes may be performed, such as chemical etching, mechanical roughening, and so on. Layer 206 including both a polymer phase and a ceramic phase may be deposited in a variety of ways. In some embodiments, the polymer material and ceramic material of the layer 206 may be deposited simultaneously. Polymer and ceramic may be deposited by co-spraying polymer and ceramic from a single spray device. Polymer and ceramic may be deposited from a single spray device with a dual feed port. Polymer and ceramic may be deposited utilizing two spray devices simultaneously, where one spray device performs an aerosol spray coating of the polymer and the other spray device performs an aerosol spray coating of the ceramic.

FIG. 2B depicts a coated article 210 including body 212 and a number of coating layers. Body 212 may be any of various chamber components, such as those discussed above in connection with body 202 of FIG. 2A. Body 212 may be composed of a variety of materials, such as those discussed above in connection with body 202. Coating layer 214 may provide a high dielectric strength, to reduce arcing to or from the surface of article 210. Coating layer 214 may include a polymer material. Coating layer 214 may share many features in common with coating layer 204 of FIG. 2A. Coating layer 218 may provide plasma resistance. Coating layer 218 may include one or more ceramic materials, including ceramic oxides, ceramic carbides, ceramic nitrides, etc. Coating layer 218 may share many features with coating layer 208 of FIG. 1A.

Article 210 includes two intermediate layers of material, coating layer 216 and coating layer 217. In some embodiments, the composition of these two layers may be different. Either or both of these layers may have features in common with coating layer 206 of FIG. 2A. In some embodiments, reducing property differences between layers at interfaces between layers may improve the performance of article 210. For example, materials of body 212, coating layer 214, and coating layer 218 may be chosen to provide the maximum utility of operation of article 210. Materials of coating layers 216 and 217 may be chosen to reduce large property changes at a single interface. For example, the polymer materials of coating layers 216 and 217 may be chosen such that a coefficient of thermal expansion in adjacent layers is below a target threshold value at each layer interface. As article 210 expands and contracts due to heating and cooling, different materials (e.g., different coating layers) may expand and contract at different rates, to different sizes, etc. Mismatch in thermal expansion coefficients between adjacent layers may cause the coating to be more susceptible to cracking, flaking, peeling, or otherwise losing bonding between layers. The material of coating layer 216 may include a different polymer phase, a different ceramic phase, and/or a different ratio of polymer content to ceramic content than coating layer 217.

In some embodiments, the final plasma resistant coating material (e.g., coating layer 208, coating layer 218) may be a thin film. In some embodiments, the coated article may comprise several layers of final plasma resistant coating material forming thin film stacks. Each thin film plasma resistant coating material layer may have a thickness of less than approximately 20 micrometers, and less than approximately 10 micrometers in some embodiments. Thin film coatings may be advantageous for improved chamber performance in some embodiments due to their dense and defect free characteristics.

Figure 3:
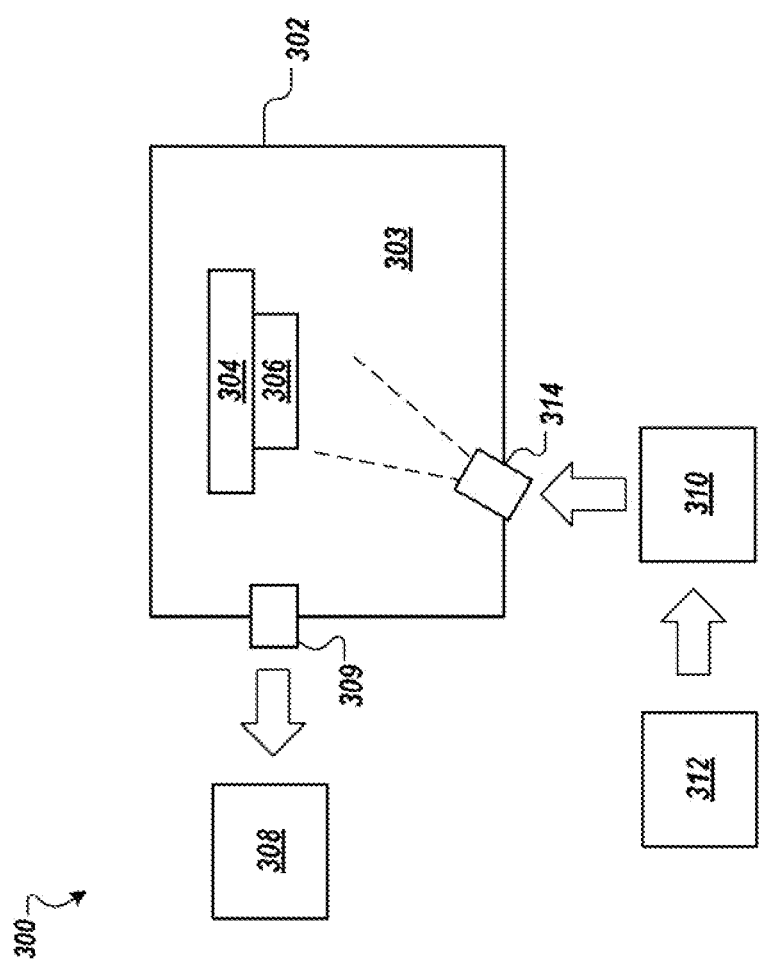
FIG. 3 illustrates an exemplary architecture of a deposition system for performing aerosol deposition, according to some embodiments.
Figure 4A:
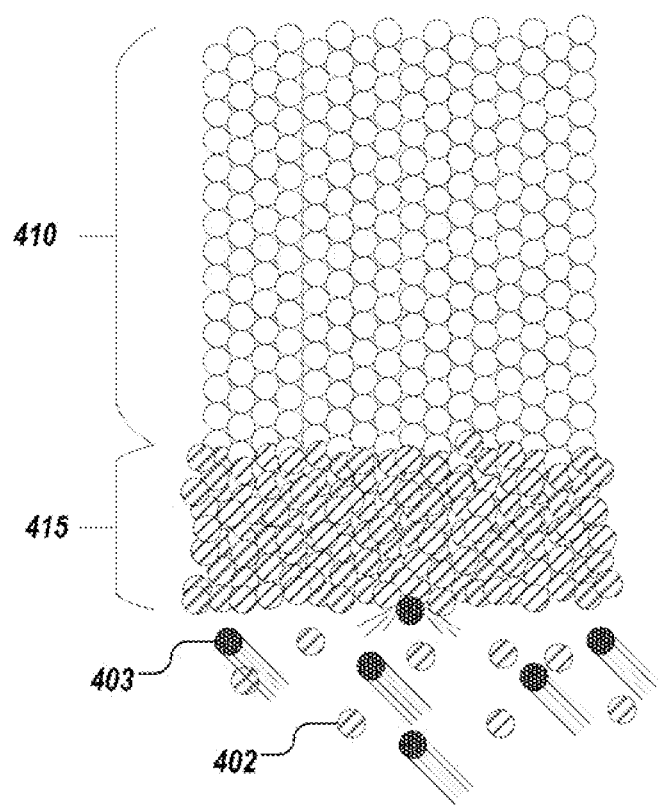
FIGS. 4A-B depict a mechanism and apparatus for performing deposition techniques utilizing energetic particles, according to some embodiments.
Figure 4B:
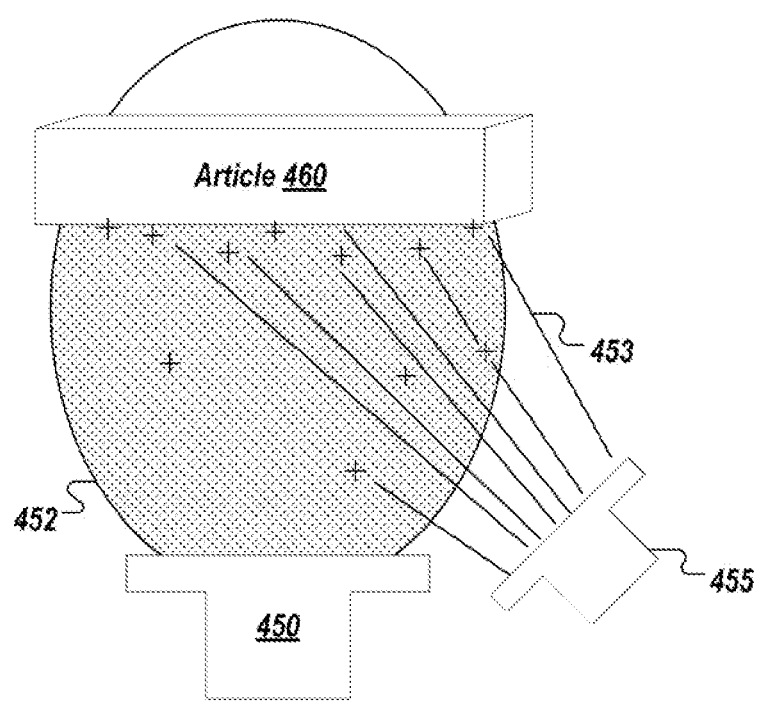
Figure 5:
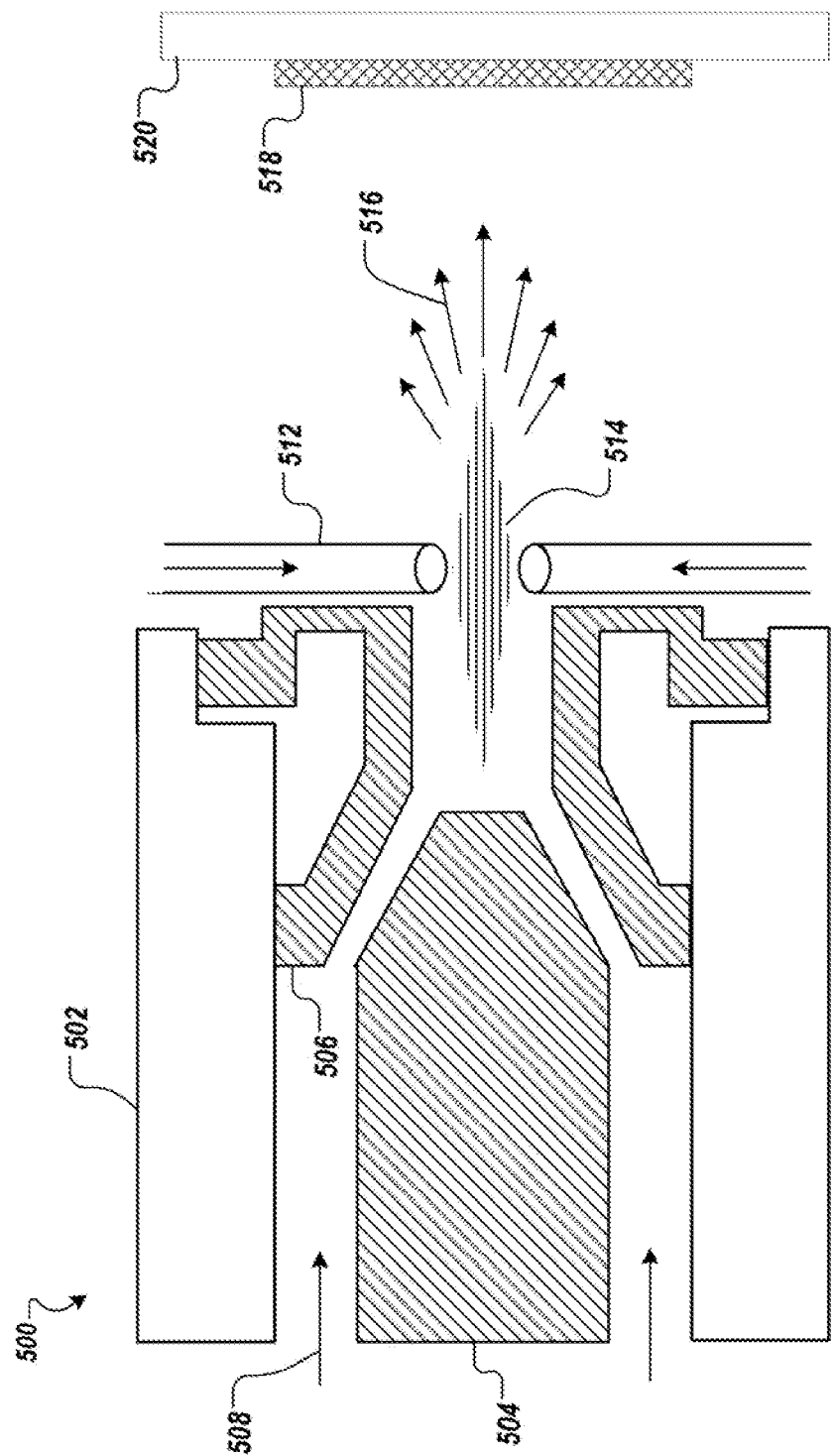
FIG. 5 depicts a schematic drawing of a plasma spray deposition apparatus used for spray deposition techniques, according to some embodiments.

FIGS. 3-5 depict a few methods for applying coatings to a component, according to some embodiments. FIG. 3 illustrates an exemplary architecture of a deposition system 300 for performing aerosol deposition, according to some embodiments. System 300 may be used for applying various coatings to a component of processing equipment. System 300 may be used to apply coatings of many types of materials, including polymer coatings (e.g., high dielectric strength coatings), ceramic coatings (e.g., plasma resistant coatings), coatings including multiple components (such as a polymer phase and a ceramic phase), or other types of coatings. System 300 includes a deposition chamber 302. The deposition chamber may include a stage 304 for mounting a component 306 to be coated (e.g., body 202 of FIG. 1A, body 212 of FIG. 1B, etc.). Ambient pressure in interior volume 303 of chamber 302 may be reduced via a vacuum system 308, coupled to inner volume 303 via exhaust port 309 defined in the body of chamber 302. Aerosol chamber 310 contains a coating powder for coating component 306, such as a polymer powder, a metal oxide powder, a mixture of powders, etc. aerosol chamber 310 is coupled to gas container 312. The coating material in aerosol chamber 310 may be in the form of a fine powder, e.g., may have particles ranging from a few μm to a few hundred μm in size. A carrier gas flows from gas container 312, through aerosol chamber 310 to interior volume 303. The carrier gas propels the coating powder through nozzle 314 for directing the coating powder onto component 306 to form a coating.

The component 306 may be a component used for semiconductor manufacturing. Component 306 may be a component of an etch reactor, a thermal reactor, a semiconductor processing chamber, or the like. Examples of possible components include a lid, a substrate support, process kit rings, a chamber liner, a nozzle, a showerhead, a wall, a base, a gas distribution plate, etc. Component 306 may be formed of a material such as aluminum, silicon, quartz, a metal oxide, a ceramic compound, a polymer, a composite, etc.

In some embodiments, the surface of component 306 may be polished to reduce a surface roughness of component 306. Reducing surface roughness may improve coating thickness and uniformity. In some embodiments, surface roughness is reduced until it is lower than the target thickness of a coating layer. In some embodiments, not all areas of component 306 are to be coated. Areas of component 306 may be masked or shielded, or otherwise removed from the area accessed by the aerosol powder. In some embodiments, coating may be removed from areas that are not to be coated after coating.

Component 306 may be mounted on stage 304 in deposition chamber 302 during deposition of a coating. Stage 304 may be a moveable stage (e.g., motorized stage) that can be moved in one, two, or three dimensions, and/or rotated in one or more dimensions, such that stage 304 can be moved to different positions to facilitate coating of component 306 with coating powder propelled from nozzle 314. For example, stage 304 may be moved to coat different portions or sides of component 306. Nozzle 314 may be selectively aimed at certain portions of component 306 from various angles and orientations.

In some embodiments, deposition chamber 302 may be evacuated using vacuum system 308. Providing a vacuum environment in inner volume 303 may facilitate application of the coating. For example, the coating powder propelled from nozzle 314 encounters less resistance as it travels to component 306 when inner volume 303 is under vacuum. Coating powder may impact component 306 more regularly, at a higher rate of speed, etc., which may facilitate adherence to component 306, facilitate formation of a coating, reduce wasted coating material, etc.

Gas container 312 holds a pressurized carrier gas. Pressurized carrier gasses that may be used include inert gasses, such as argon, nitrogen, krypton, etc. The pressurized carrier gas travels under pressure from gas container 312 to aerosol chamber 310. As the pressurized gas travels from aerosol chamber 310 to nozzle 314, the carrier gas propels some of the coating powder from aerosol chamber 310 toward nozzle 314.

In some embodiments, system 300 may be used to deposit a single material onto one or more surfaces of component 306. In some embodiments, system 300 may be used to deposit multiple materials onto component 306. In some embodiments, a polymer layer including multiple polymers may be deposited on component 306. In some embodiments, a ceramic layer including multiple ceramic materials may be deposited on component 306. In some embodiments, a material including a polymer phase and a ceramic phase may be deposited on component 306. Multiple materials may be co-deposited by providing a mixture of powdered materials to aerosol chamber 310. In an alternate embodiment, two or more aerosol chambers may be coupled to pressurized gas and to nozzle 314, with each providing material to nozzle 314 separately. In an alternate embodiment, multiple nozzles may receive material from multiple aerosol chambers coupled to pressurized carrier gas. These embodiments may allow multiple materials to be deposited simultaneously.

As the carrier gas propelling a suspension of coating powder enters deposition chamber 302 from nozzle 314, the coating powder is propelled towards component 306. In one embodiment, the carrier gas is pressurized such that the coating powder is propelled towards component 306 at a rate between 150 m/s and 500 m/s. In some embodiments, particle size of the coating powder(s), and pressure(s) of carrier gas(ses) may be tuned for a target velocity distribution of coating powder.

In some embodiments, nozzle 314 is formed to be wear resistant. Due to movement of coating powder through nozzle 314 at high velocity, nozzle 314 can rapidly wear and degrade. Nozzle 314 may be formed in a shape and from a material such that wear is reduced.

In some embodiments, upon impacting component 306 particles of the coating powder fracture and deform from kinetic energy to produce a layer that adheres to component 306. As the application of coating powder continues, the particles become a coating or film by bonding to themselves. The coating on component 306 continues to grow by continuous collision of the particle of the coating powder on component 306. In some embodiments, particles mechanically collide with each other and with the substrate at a high speed under a vacuum to break into smaller pieces to form a dense layer, rather than melting. In some embodiments, crystal structure of particles of coating powder in aerosol chamber 310 is preserved through application to component 306. In some embodiments, melting of particles may occur when kinetic energy is converted to thermal energy. In some embodiments, aerosol deposition may be performed at room temperature, or between 15° C. and 35° C. In some embodiments, component 306 does not need to be heated and the aerosol application process may not significantly increase the temperature of component 306. Applications such as this may be used to coat assemblies that may be damaged in an environment of elevated temperature. For example, components formed of multiple parts affixed together with a bonding layer that melts at a low temperature may be damaged in a deposition process carried out at elevated temperatures. As a further example, components formed of multiple parts of different materials with different thermal expansion properties may be damaged as the parts expand at different rates, to different sizes, etc., during deposition. Such components may be less likely to be damaged by coating at ambient temperatures.

In some embodiments, aerosol deposition may be performed at an elevated temperature. In some embodiments, component 306 may be heated before or during aerosol deposition. Such heating may encourage melting of coating powder. In some embodiments, after deposition occurs, component 306 may be placed in an oven for heating of the component and coating material for a time. The temperature of component 306 and the coating may increase, such that the coating partially or fully melts. The coating may be allowed to flow over the surface of component 306, for example to improve uniformity of the coating, to allow the coating to reach new areas of the surface of component 306, etc.

In some embodiments, the coated component may be subjected to a post-coating process. For example, a ceramic coating may be polished or ground after application to component 306. Coated components may be subjected to other post-coating processes, such as thermal treatment. A thermal treatment in some embodiments forms a coating interface between the coating and the component. For example, a yttria ($Y_2O_3$) coating over an alumina ($Al_2O_3$) component can form a yttrium aluminum garnet (YAG) layer that aids in adhesion and provides further protection to the component. A barrier layer may reduce the occurrence of delamination, chipping, flaking, peeling, etc. Thermal treatment may also alter the chemical composition of the coating—a dual yttria/alumina coating may be converted to a YAG coating by thermal treatment.

FIGS. 4A-B depict a mechanism and apparatus for performing deposition techniques utilizing energetic particles, according to some embodiments. FIG. 4A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)) and sputtering in the presence of ion bombardment to form coatings as described herein. Any of the IAD methods may be performed in the presence of a reactive gas species, such as $O_2$, $N_2$, halogens, etc.

As shown, a thin coating layer 415 is formed by an accumulation of deposition materials 402 in the presence of energetic particles 403 such as ions. The deposition materials 402 include atoms, ions, radicals, or their mixture. The energetic particles 403 may impinge and compact the thin final plasma resistant coating layer 415 as it is formed.

In one embodiment, IAD is utilized to form a thin coating layer 415, as previously described elsewhere herein. FIG. 4B depicts a schematic of an IAD deposition apparatus. As shown, a material source 450 provides a flux of deposition materials 452 for deposition on article 460 while an energetic particle source 455 provides a flux of the energetic particles 453, both of which impinge upon the article 460 throughout the IAD process. The energetic particle source 455 may be an oxygen or other ion source. The energetic particle source 455 may also provide other types of energetic particles such as inert radicals, neutron atoms, and nano-sized particles which come from particle generation sources (e.g., from plasma, reactive gases or from the material source that provide the deposition materials). IAD may utilize one or more plasmas or beams to provide the material and energetic ion sources. Reactive species may also be provided during deposition of the plasma resistant coating.

With IAD processes, the energetic particles 453 may be controlled by the energetic ion (or other particle) source 455 independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition. The ion energy may be roughly categorized into low energy ion assist and high energy ion assist. The ions are projected with a higher velocity with high energy ion assist than with low energy ion assist. In general superior performance has been shown with high energy ion assist. Substrate (article) temperature during deposition may be roughly divided into low temperature (around 120-150° C. in one embodiment which is typical room temperature) and high temperature (around 270° C. in one embodiment).

FIG. 5 depicts a schematic drawing of a plasma spray deposition apparatus 500 used for spray deposition techniques, according to some embodiments. The plasma spray apparatus 500 may include a casing 502 that encases a nozzle anode 506 and a cathode 504. The casing 502 permits gas flow 508 through the plasma spray device 500 and between the nozzle anode 506 and the cathode 504. An external power source may be used to apply a voltage potential between the nozzle anode 506 and the cathode 504. The voltage potential produces an arc between the nozzle anode 506 and the cathode 504 that ignites the gas flow 508 to produce a plasma gas. The ignited plasma gas flow 508 produces a high-velocity plasma plume 514 that is directed out of the nozzle anode 506 and toward an article 520.

The plasma spray apparatus 500 may be located in a chamber or atmospheric booth. In some embodiments, the gas flow 508 may be a gas or gas mixture including, but not limited to, argon, nitrogen, hydrogen, helium, and combinations thereof. In some embodiments, wherein the spray system is used to perform slurry plasma spray, the plasma spray apparatus 500 may be equipped with one or more fluid lines 512 to deliver a slurry into the plasma plume 514. In some embodiments, a particle stream 516 is generated from plasma plume 514 and is propelled towards article 520. Upon impact with the article 520, the particle stream forms a coating 518.

Figure 6A:
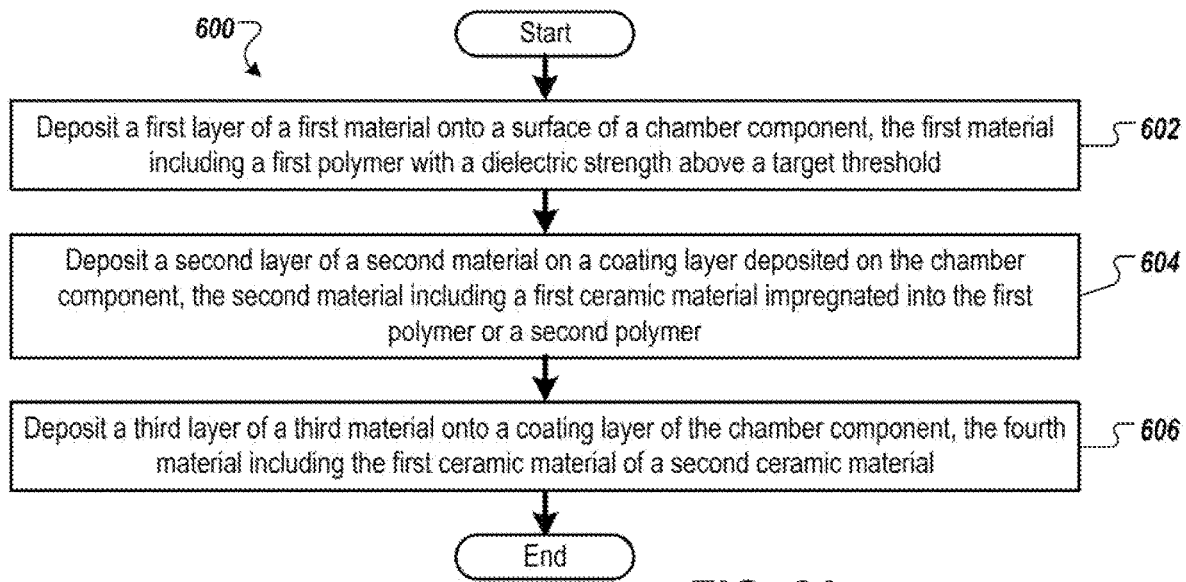
FIGS. 6A-B are flow diagrams depicting methods for depositing a protective coating on a component, according to some embodiments.
Figure 6B:
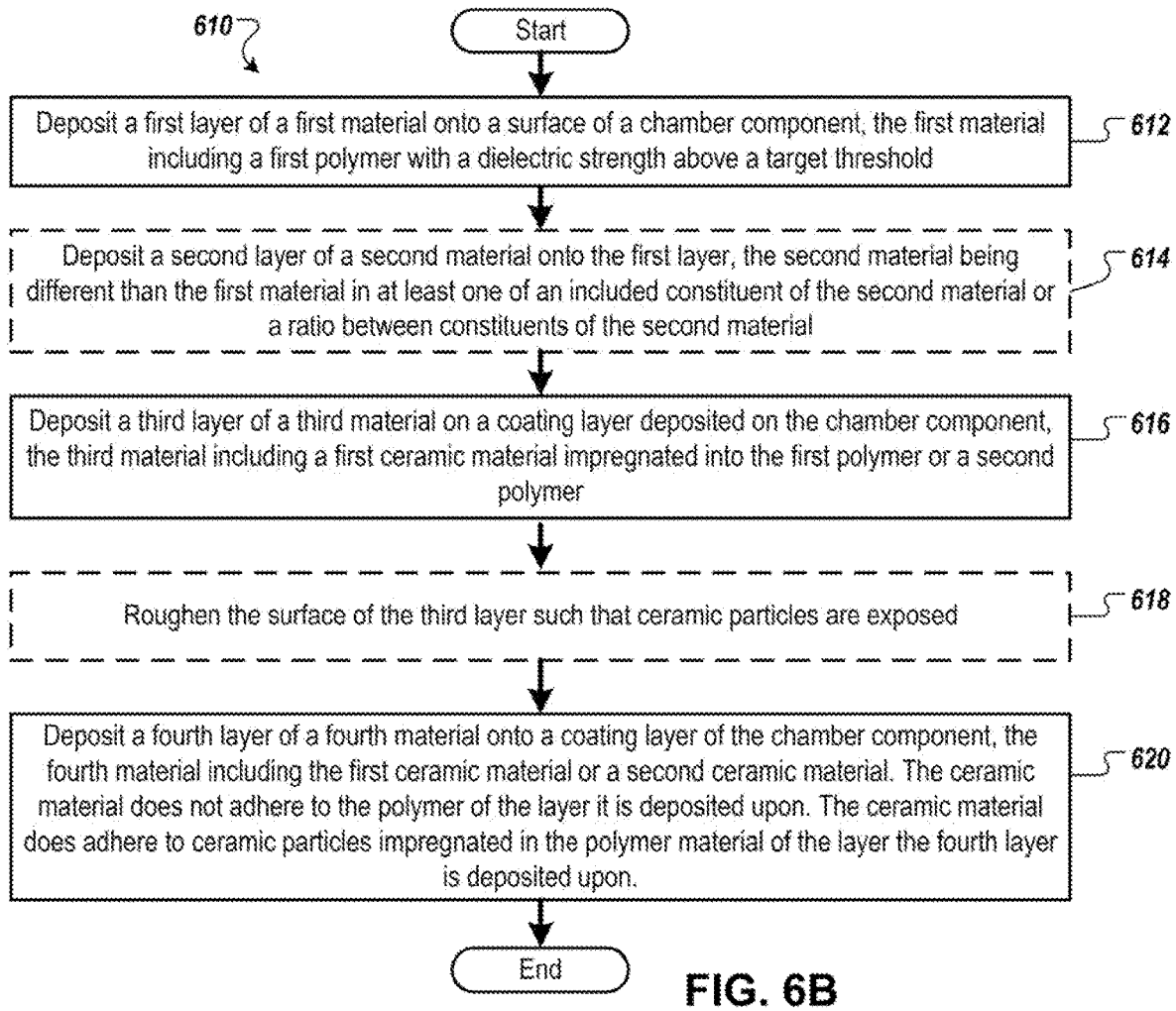

FIGS. 6A-B are flow diagrams depicting methods for depositing a protective coating on a processing chamber component, according to some embodiments. FIG. 6A is a flow diagram depicting method 600 for depositing a dual arc-resistant and plasma-resistant protective coating on a component. In some embodiments, the chamber component comprises a substrate support (e.g., electrostatic chuck). At block 602, a first layer of a first material is deposited onto a surface of a chamber component. In some embodiments, the surface comprises a sidewall of a substrate support. Before depositing the first layer, the surface to be coated may have undergone one or more preparation procedures. The surface of the component may be cleaned. A pre-coating may be applied to the surface, for example a primer. In some embodiments, the primer is a material designed to adhere to both a chamber component and the first material. In some embodiments, the primer may be a polymer including monomers from the polymer of the first material. In some embodiments, the first material may be a polymer of ethylene and chlorotrifluoroethylene, and the primer include a polymer of ethylene, chlorotrifluoroethylene, and hexafluoroisobutene. Cleaning and pre-coating procedures may increase adhesion of the first layer to the component, may improve the characteristics of the coated body, etc. The first material composing the first layer includes a first polymer. The first material exhibits a dielectric strength above a target threshold, chosen to prevent arcing in a target application for the chamber component. For example, processes where components carry more electrical energy (higher current, higher voltage, etc.) may be coated with a material with a higher dielectric strength. A target dielectric strength may have any value, for example above 20 MV/m, above 40 MV/m, above 50 MV/m, above 70 MV/m, etc. Suitable polymers include polymers of ethylene, polymers of propylene, polymers of styrene, halogenated versions of these, polymers of mixtures of monomers, etc. The first material may be a mixture of two or more polymers. The first material may include non-polymer materials, such as additives.

The first material may be deposited by any suitable means. In some embodiments, the first material is deposited via aerosol deposition, as described more fully in connection with FIG. 3. The first material may undergo a curing process after deposition, such as a thermal cure, a chemical cure, an ultraviolet cure, etc. The first material may be deposited in a number of steps (e.g., layers) to achieve a target thickness. The target thickness may be tuned to the target application for the chamber component. In some embodiments, a target thickness may be between 1 thousandth and 20 thousandths of an inch. In some embodiments, a target thickness may be between 2 thousandths and 15 thousandths of an inch. In some embodiments, a target thickness may be between 3 thousandths and 10 thousandths of an inch.

At block 604, a second layer of the coating is deposited onto the first layer. The second layer is composed of a second material. The second material includes a polymer phase and a ceramic phase. The polymer phase may be of the same or different composition from the polymers including in the first layer. The ceramic phase may include ceramic oxides, ceramic nitrides, ceramic carbides, other ceramic materials, or mixtures of these materials. The second material may be a polymer phase impregnated with ceramic particles. In some embodiments, the ceramic particles may fall within a target size range. In some embodiments, the ceramic particles may be between 1 µm and 80 µm in size. In some embodiments, the ratio of ceramic material to polymer material may fall within a target range. In some embodiments, the second material may include between 10 volume percent and 90 volume percent ceramic material. In some embodiments, the second material may include between 20 volume percent and 80 volume percent ceramic material. The second material may be deposited by any suitable deposition technique. The polymer phase (which may include any of the polymer materials discussed in connection with the first layer) may be co-deposited with the ceramic phase. The second material may be deposited by aerosol deposition. In some embodiments, the second layer may be of a target thickness. In some embodiments, the target thickness of the second layer may be between 1 and 10 thousandths of an inch. In some embodiments, the target thickness may be between 1 and 5 thousandths of an inch.

At block 606, a third layer of a third material is deposited onto the second layer of the coating of the chamber component. The third material includes a ceramic material. The ceramic material may provide plasma resistance to the coating, the component, etc. The ceramic material may be the first ceramic material or a second ceramic material. The third material may include similar ceramic compositions as those appropriate for use in the first ceramic phase of the second layer. In some embodiments, the third material does not adhere to the polymer phase of the first layer, and/or does not adhere to the polymer phase of the second layer. By "does not adhere," it is meant that the adhesion between the materials of the third layer and material of another layer (e.g., the first material of the first layer) is not sufficiently strong to enable the coating to withstand the target processing and target use of the chamber component. For example, the ceramic material of the third layer may, if applied directly to the first layer of the first material, delaminate, flake, peel, chip, or otherwise separate from the first layer under normal processing or operating conditions of the chamber component. The material of the third layer may adhere to the ceramic particles of the second material of the second layer. Ceramic particles of the second layer may provide anchor points for the third layer of the coating. The third layer may be deposited using any suitable technique. In some embodiments, the third layer may be deposited using plasma deposition, as discussed in more detail in connection with FIG. 5. In some embodiments, The third layer may be of a target thickness. In some embodiments, the target thickness may be between 5 and 40 thousandths of an inch. In some embodiments, the target thickness may be between 10 and 25 thousandths of an inch. In some embodiments, the fourth layer may undergo further processing after deposition, including heat processing, grinding, polishing, etc.

FIG. 6B is a flow diagram depicting an extended method 610 for depositing a protective coating on a component, including additional operations, according to some embodiments. In some embodiments, the chamber component comprises a substrate support (e.g., electrostatic chuck). At block 612, a first layer of a first material is deposited onto a surface of a chamber component. In some embodiments, the surface comprises a sidewall of a substrate support. Before depositing the first layer, the surface to be coated may have undergone one or more preparation procedures. The surface of the component may be cleaned. A pre-coating may be applied to the surface, for example a primer. In some embodiments, the primer is a material designed to adhere to both a chamber component and the first material. In some embodiments, the primer may be a polymer including monomers from the polymer of the first material. In some embodiments, the first material may be a polymer of ethylene and chlorotrifluoroethylene, and the primer include a polymer of ethylene, chlorotrifluoroethylene, and hexafluoroisobutene. Cleaning and pre-coating procedures may increase adhesion of the first layer to the component, may improve the characteristics of the coated body, etc. The first material composing the first layer includes a first polymer. The first material exhibits a dielectric strength above a target threshold, chosen to prevent arcing in a target application for the chamber component. For example, processes where components carry more electrical energy (higher current, higher voltage, etc.) may be coated with a material with a higher dielectric strength. A target dielectric strength may have any value, for example above 20 MV/m, above 40 MV/m, above 50 MV/m, above 70 MV/m, etc. Suitable polymers include polymers of ethylene, polymers of propylene, polymers of styrene, halogenated versions of these, polymers of mixtures of monomers, etc. The first material may be a mixture of two or more polymers. The first material may include non-polymer materials, such as additives.

The first material may be deposited by any suitable means. In some embodiments, the first material is deposited via aerosol deposition, as described more fully in connection with FIG. 3. The first material may undergo a curing process after deposition, such as a thermal cure, a chemical cure, an ultraviolet cure, etc. The first material may be deposited in a number of steps (e.g., layers) to achieve a target thickness. The target thickness may be tuned to the target application for the chamber component. In some embodiments, a target thickness may be between 1 thousandth and 20 thousandths of an inch. In some embodiments, a target thickness may be between 2 thousandths and 15 thousandths of an inch. In some embodiments, a target thickness may be between 3 thousandths and 10 thousandths of an inch.

At block 614, a second layer is optionally deposited onto the first layer. The second layer is composed of a second material, the second material being different than the first material. The second layer may comprise one or more polymers. The second layer may include the same polymer(s) as the first layer or different polymers. The second material may be different from the first material in terms of included compounds (e.g., polymers), ratio of components included in the second material, or both. The second material may be chosen to improve the properties of the coated chamber component. For example, the second material may be chosen such that adhesion between the first layer (e.g., polymer of the first layer) and the second layer, and adhesion between the second layer and a third layer are both stronger than adhesion would be between the first layer and the third layer. As an alternate example, the second material may be chosen such that a property has smaller jumps at interfaces between layers, for instance, the second material may be chosen such that it exhibits properties of thermal expansion between those of the first and third layers. This may improve the integrity of the coating, reducing the chance of delamination, peeling, cracking, etc. The second layer may be deposited by any suitable technique. In some embodiments, the second layer may be deposited by aerosol deposition. In some embodiments, deposition may occur at an elevated temperature to allow the second material to flow, and cover the surface to be coated. In some embodiments, heating may be carefully controlled (e.g., controlled temperature, controlled time of heating) to melt the second material and not the first material. In some embodiments, heating may be controlled to avoiding melting the first layer to a sufficient level to destroy the separate compositions, properties, etc., of the first and second materials. In some embodiments, the second material may be chosen such that a deposition temperature effective for the second material does not cause the first material to melt. In some embodiments, the second material may be chosen such that a deposition temperature effective for flowing the second material does not cause the first material to melt significantly enough to thoroughly mix the first material and second material. In some embodiments, separation of the first and second materials may be controlled by restricting a time of heating.

At block 616, a third layer of the coating is deposited onto the second layer. The third layer is composed of a third material. The third material includes a polymer phase and a ceramic phase. The polymer phase may be of the same or different composition from the polymers including in the first or second layer. The ceramic phase may include ceramic oxides, ceramic nitrides, ceramic carbides, other ceramic materials, or mixtures of these materials. The third material may be a polymer phase impregnated with ceramic particles. In some embodiments, the ceramic particles may fall within a target size range. In some embodiments, the ceramic particles may be between 1 μm and 80 μm in size. In some embodiments, the ratio of ceramic material to polymer material may fall within a target range. In some embodiments, the third material may include between 10 volume percent and 90 volume percent ceramic material. In some embodiments, the third material may include between 20 volume percent and 80 volume percent ceramic material. The third material may be deposited by any suitable deposition technique. The polymer phase (which may include any of the polymer materials discussed in connection with the first layer) may be co-deposited with the ceramic phase. The third material may be deposited by aerosol deposition. Many of the same techniques for preserving the properties of the first and second layers described in connection with deposition of the second layer may also be applied to deposition of the third material. In some embodiments, the third layer may be of a target thickness. In some embodiments, the target thickness of the third layer may be between 1 and 10 thousandths of an inch. In some embodiments, the target thickness may be between 1 and 5 thousandths of an inch.

At block 618, a surface of the third layer is optionally roughened. In some embodiments, deposition techniques used to deposit the third layer may result in a relatively small surface area of the ceramic material of the third layer being exposed. In some embodiments, a fourth layer may be deposited which adheres to the ceramic particles of the third layer. The surface of the third layer may be roughened to expose a greater surface area of ceramic particles included in the third material of the third layer. The surface of the third layer may be roughened using any suitable technique, e.g., dependent upon the composition of the third material. Techniques for roughening the surface of the third layer may include methods of abrasion, liquid etching (e.g., acid etching), gas etching (e.g., reactive gas etching, including flame, corona, plasma, etc.), or the like.

At block 620, a fourth layer of a fourth material is deposited onto the third layer of the coating of the chamber component. The fourth material includes a ceramic material. The ceramic material may provide plasma resistance to the coating, the component, etc. The ceramic material may be the first ceramic material or a second ceramic material. The fourth material may include similar components as those appropriate for use in the first ceramic phase of the third layer. In some embodiments, the fourth material does not adhere to the polymer phase of the third layer, does not adhere to the polymer phase of the second layer, does not adhere to the polymer of the first layer, etc. By "adhere," it is meant that the adhesion between the materials of the fourth layer and another layer (e.g., the first material of the first layer) is not sufficiently strong to enable the coating to withstand the target processing and target use of the chamber component. For example, the ceramic material of the fourth layers may, if applied directly to the first layer of the first material, delaminate, flake, peel, chip, or otherwise separate from the first layer under normal processing or operating conditions of the chamber component. The material of the fourth layer may adhere to the ceramic particles of the third material of the third layer. Ceramic particles of the third layer may provide anchor points for the fourth layer of the coating. The fourth layer may be deposited using any suitable technique. In some embodiments, the fourth layer may be deposited using plasma deposition, as discussed in more detail in connection with FIG. 5. In some embodiments, The fourth layer may be of a target thickness. In some embodiments, the target thickness may be between 5 and 40 thousandths of an inch. In some embodiments, the target thickness may be between 10 and 25 thousandths of an inch. In some embodiments, the fourth layer may undergo further processing after deposition, including heat processing, grinding, polishing, etc.

The preceding description sets forth numerous specific details such as examples of specific systems, components, methods, and so forth, in order to provide a good understanding of several embodiments of the present disclosure. It will be apparent to one skilled in the art that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Preceding descriptions refer to applying coatings to various components, bodies, articles, etc. In some cases, a coating or layer is described as being applied "on" or "onto" a body, layer, material, etc. Unless clear from the context, a layer described as being "on" a layer, body, component, material, etc., may not be directly adjacent to what the layer is on, and there may be an intervening layer of another material between.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
    depositing a first layer of a first material onto a surface of a chamber component of a processing chamber, wherein the first material comprises a first polymer having a dielectric strength of at least 40 MV/m;
    depositing a second layer of a second material onto the first layer, wherein the second material comprises a first ceramic material impregnated into the first polymer or a second polymer, and wherein depositing the second layer comprises co-spraying polymer aerosol of the first polymer or the second polymer and ceramic particles of the first ceramic material; and
    depositing a third layer comprising a third material onto the second layer, wherein the third material comprises the first ceramic material or a second ceramic material, wherein the first ceramic material or the second ceramic material does not adhere to the first polymer or the second polymer, and wherein the first ceramic material or the second ceramic material adheres to the first ceramic material.

2. The method of claim 1, wherein the third material comprises a plasma resistant ceramic material.

3. The method of claim 1, wherein the first layer is deposited by aerosol deposition, wherein the aerosol deposition comprises spraying a powder comprising the first material onto the chamber component, heating the chamber component, and allowing the first material to flow to form the first layer.

4. The method of claim 1, further comprising roughening the surface of the second layer, wherein the roughening is performed such that a surface area of exposed ceramic material is increased.

5. The method of claim 1, wherein the first ceramic material is present in the second material in an amount between 10 and 90 percent, measured by volume.

6. The method of claim 1, wherein at least one of the first ceramic material or the second ceramic material comprises one or more of $Al_2O_3$, $Y_2O_3$, $Y_3Al_5O_{12}$, $Y_2Al_4O_9$, or $ZrO_2$.

7. The method of claim 1, further comprising:
    depositing, between the second and third layers, a fourth layer of a fourth material, wherein the fourth material is different from the first material and the second material, and wherein the fourth material comprises a polymer.

8. The method of claim 1, wherein the first layer is of a thickness between 2 thousandths of an inch and 15 thousandths of an inch, the second layer is of a thickness between 1 thousandth of an inch and 10 thousandths of an inch, and the third layer is of a thickness between 8 thousandths of an inch and 30 thousandths of an inch.

9. The method of claim 1, wherein the first polymer comprises at least one of a polymer comprising ethylene monomers, a polymer comprising fluorinated ethylene monomers, or a polymer comprising chlorinated ethylene monomers.

10. The method of claim 1, wherein the chamber component comprises a substrate support, and the surface of the chamber component comprises a sidewall of the substrate support.

11. A chamber component for a processing chamber, comprising:
    a body; and
    a coating deposited on the body, wherein the coating comprises:
    a first layer of a first material deposited onto a surface of the body, the first material comprising a first polymer having a dielectric strength of at least 40 MV/m;
    a second layer of a second material, the second material comprising a first ceramic material impregnated into the first polymer or a second polymer;
    a third layer of a third material, the third material comprising the first ceramic material or a second ceramic material impregnated in the first polymer, the second polymer or a third polymer; and
    a fourth layer of a fourth material, the fourth material comprising the first ceramic material, the second ceramic material, or a third ceramic material, wherein the first ceramic material or the second ceramic material does not adhere to the first polymer or the second polymer, and wherein the first ceramic material or the second ceramic material adheres to the first ceramic material.

12. The chamber component of claim 11, wherein the fourth material comprises a plasma resistant ceramic material.

13. The chamber component of claim 11, wherein the second layer is formed by depositing the first or second polymer and simultaneously depositing the first ceramic material.

14. The chamber component of claim 11, wherein the first ceramic material is present in the second material in an amount between 10 and 90 percent, measured by volume.

15. The chamber component of claim 11, wherein the first polymer comprises at least one of a polymer comprising ethylene monomers, a polymer comprising fluorinated ethylene monomers, or a polymer comprising chlorinated ethylene monomers.

16. The chamber component of claim 11, wherein a coefficient of thermal expansion of the third material is between a coefficient of thermal expansion of the second material and a coefficient of thermal expansion of the fourth material.

17. A processing chamber, comprising:
    a substrate support; and
    a coating deposited on a surface of the substrate support, the coating comprising:

a first layer of a first material deposited onto a surface of the substrate support, the first material comprising a first polymer having a dielectric strength of at least 40 MV/m;

a second layer of a second material, the second material comprising a first ceramic material impregnated into the first polymer or a second polymer;

a third layer of a third material, the third material comprising the first ceramic material or a second ceramic material impregnated in the first polymer, the second polymer or a third polymer; and a fourth layer of a fourth material, the fourth material comprising the first ceramic material, the second ceramic material, or a third ceramic material, wherein the first ceramic material or the second ceramic material does not adhere to the first polymer or the second polymer, and wherein the first ceramic material or the second ceramic material adheres to the first ceramic material.

18. The processing chamber of claim 17, wherein the third material comprises a plasma resistant ceramic material.

19. The processing chamber of claim 17, wherein the second layer is formed by depositing the first or second polymer and simultaneously depositing the first ceramic material.

20. The processing chamber of claim 17, wherein the first ceramic material is present in the second material in an amount between 10 and 90 percent, measured by volume.

* * * * *